(12) United States Patent
Ojiro

(10) Patent No.: US 7,663,163 B2
(45) Date of Patent: Feb. 16, 2010

(54) SEMICONDUCTOR WITH REDUCED PAD PITCH

(75) Inventor: Tsukasa Ojiro, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 24 days.

(21) Appl. No.: 11/777,033

(22) Filed: Jul. 12, 2007

(65) Prior Publication Data

US 2008/0012046 A1    Jan. 17, 2008

(30) Foreign Application Priority Data

Jul. 13, 2006  (JP) .............................. 2006-192606

(51) Int. Cl.
*H01L 23/48* (2006.01)
*H01L 23/58* (2006.01)
*G01R 31/28* (2006.01)
*G01R 31/26* (2006.01)
*G01R 31/3185* (2006.01)
*H03K 19/00* (2006.01)
*H05K 7/00* (2006.01)

(52) U.S. Cl. ............ 257/203; 257/E23.02; 257/E23.01; 257/E23.153; 257/48; 257/620; 257/786; 257/784; 257/211; 257/207; 257/208; 257/691; 257/692; 257/773; 327/565; 327/564; 324/765; 324/763; 326/16; 361/767; 361/760

(58) Field of Classification Search ................ 257/203, 257/773, 692, 691, E23.02, E23.01, 620, 257/48, 786, 784, 211, 208, 207, E23.153; 327/565, 564; 326/16; 361/767, 760; 324/765, 324/763
See application file for complete search history.

(56) References Cited

U.S. PATENT DOCUMENTS

| 5,233,241 | A  | * | 8/1993  | Nishimori ..................... 326/38 |
| 5,535,084 | A  | * | 7/1996  | Nakayama .................... 361/56 |
| 6,130,484 | A  | * | 10/2000 | Kameda et al. .............. 257/786 |
| 6,356,095 | B1 | * | 3/2002  | Komoriya ................... 324/763 |
| 6,433,628 | B1 | * | 8/2002  | Morris ........................ 327/565 |
| 6,756,803 | B2 | * | 6/2004  | Miura et al. ................. 324/763 |
| 6,900,691 | B2 | * | 5/2005  | Furue .......................... 327/564 |
| 7,190,593 | B2 | * | 3/2007  | Aiki et al. ..................... 361/767 |
| 7,330,043 | B2 | * | 2/2008  | Yamamoto et al. .......... 324/765 |
| 2004/0027150 | A1 | * | 2/2004 | Miura et al. ................. 324/765 |
| 2008/0175080 | A1 | * | 7/2008 | Kim et al. .................... 365/201 |
| 2008/0288840 | A1 | * | 11/2008 | Whetsel ...................... 714/727 |

FOREIGN PATENT DOCUMENTS

| JP | 9-293747   | * 11/1997 |
| JP | 2002329742 |   11/2002 |
| JP | 2003163267 |    6/2003 |

* cited by examiner

*Primary Examiner*—Alexander O Williams
(74) *Attorney, Agent, or Firm*—Young & Thompson

(57) ABSTRACT

A semiconductor device includes a first pad, a second pad and a third pad. The first pad and the third pad are electrically connected to each other. The first pad and the second pad are used for bonding. The second pad and the third pad are used for probing. According to this structure, Small size semiconductor device having high reliability even after a probing test can be provided.

6 Claims, 21 Drawing Sheets

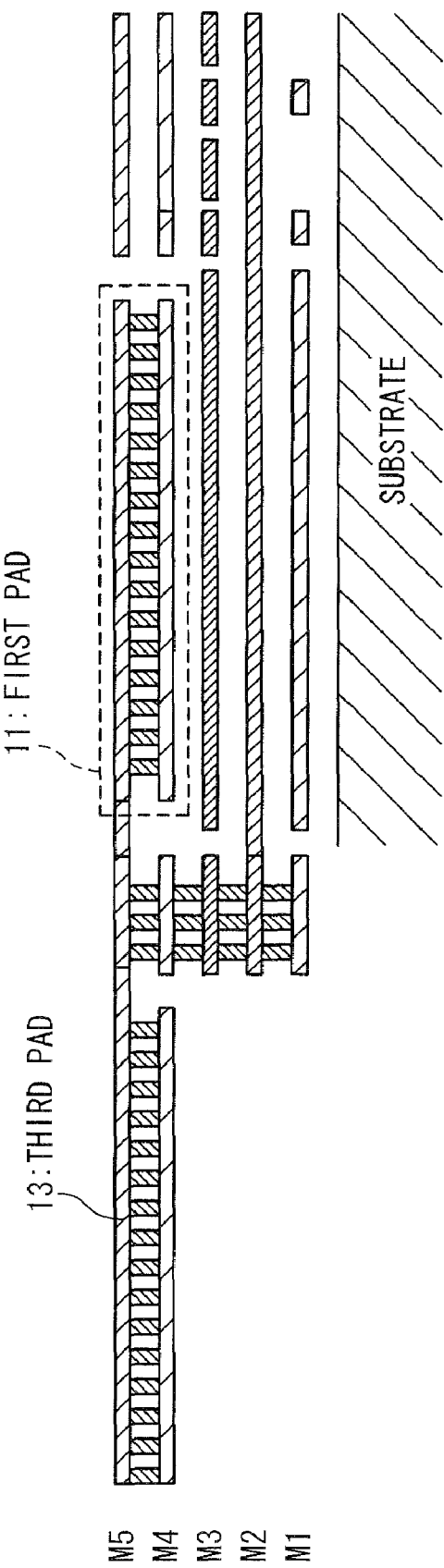

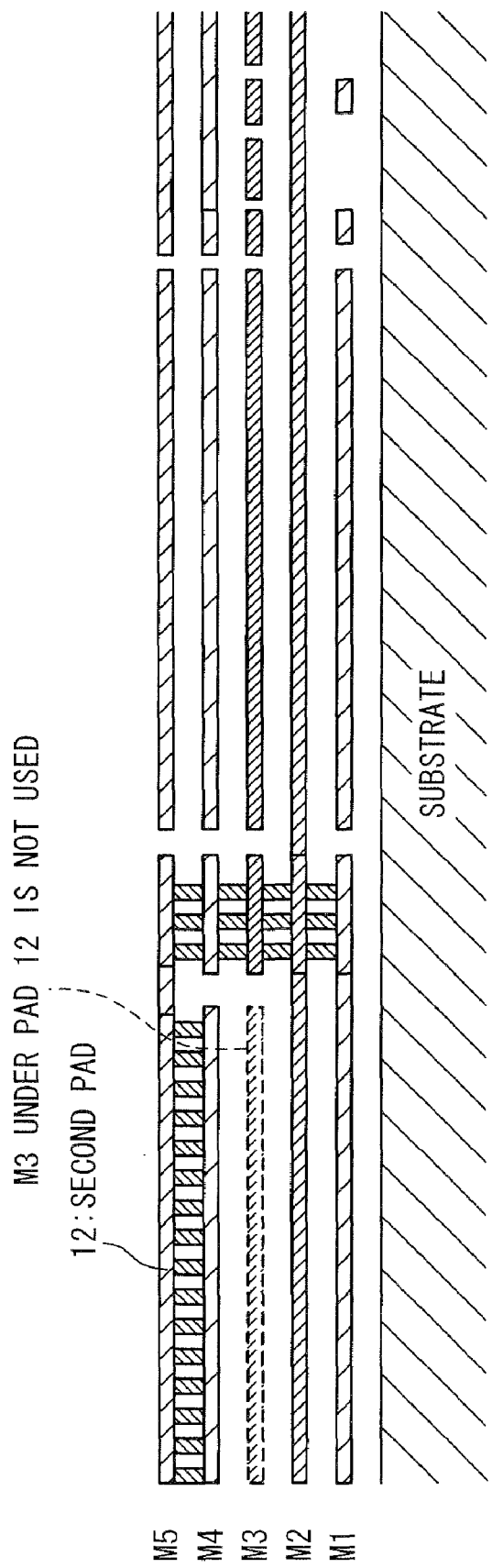

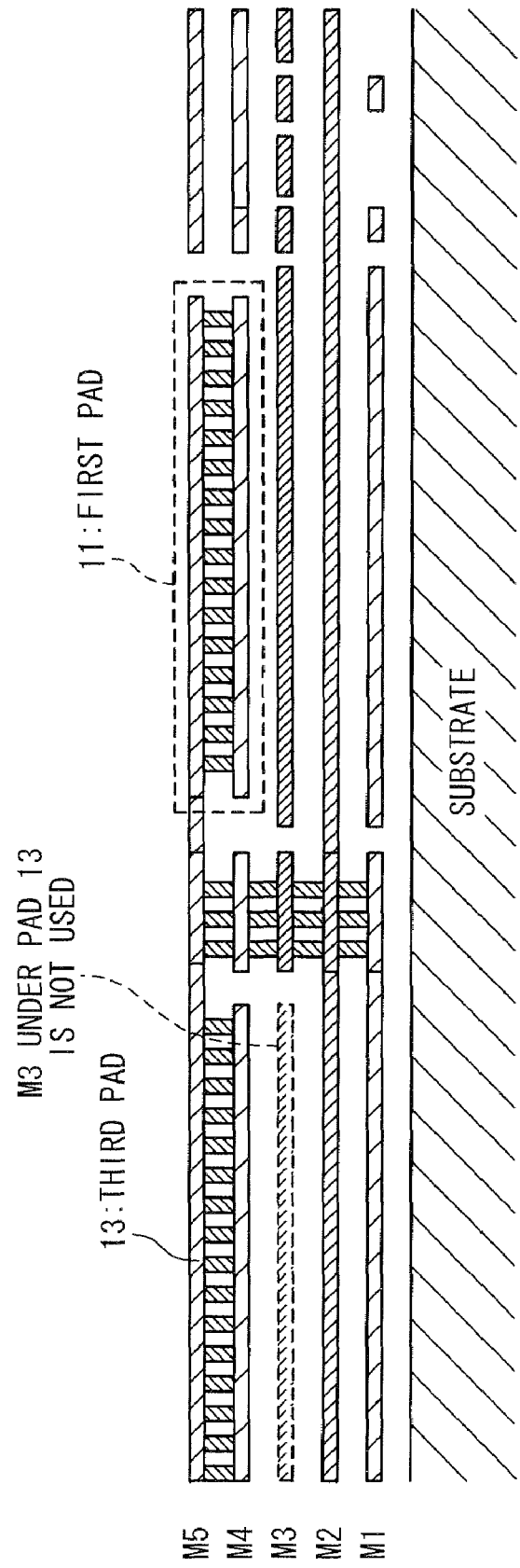

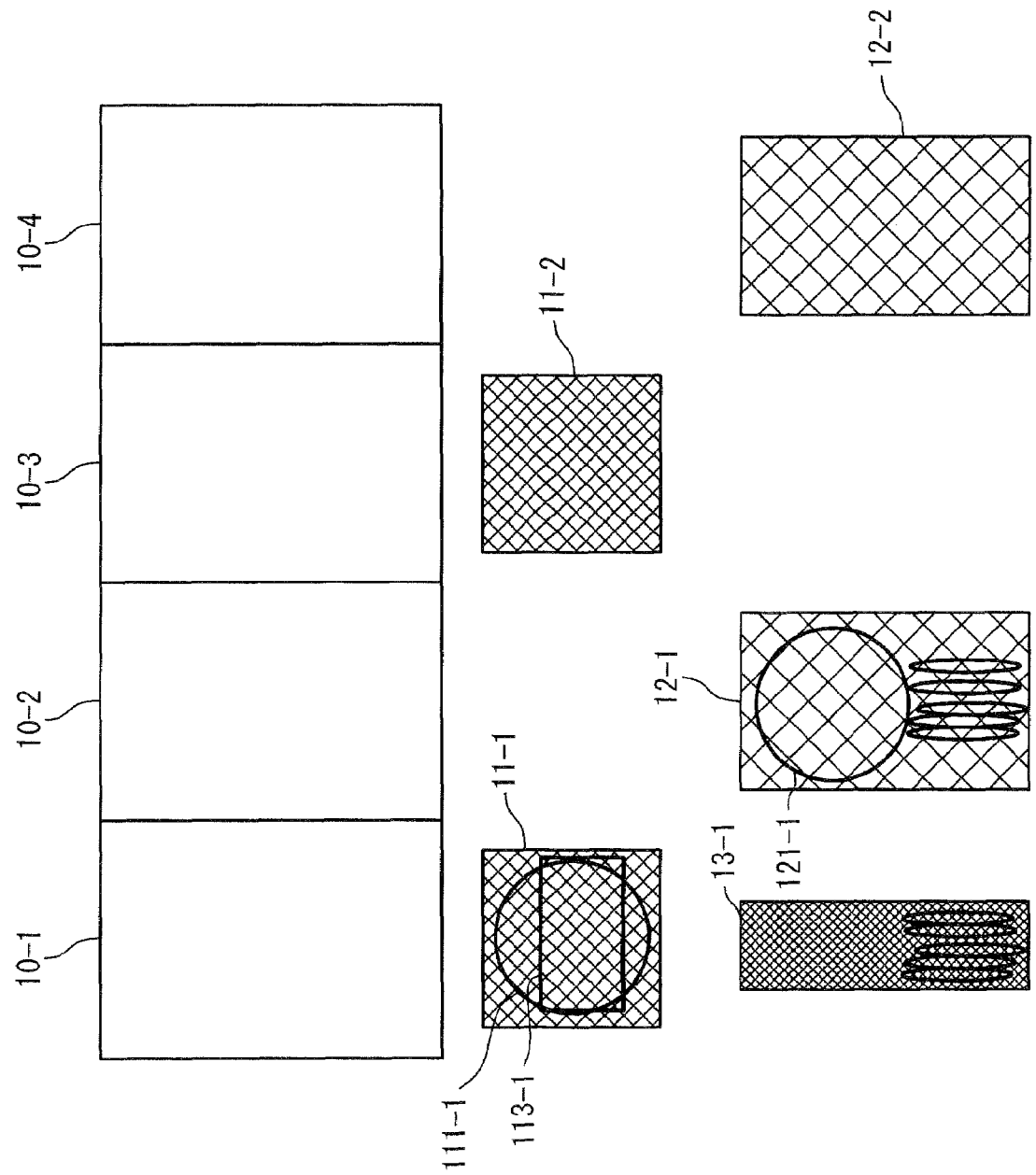

SEMICONDUCTOR WITH REDUCED PAD PITCH

BACKGROUND OF THE INVENTION

1. Field of the Invention

The present invention relates to a semiconductor device, and especially relates to a semiconductor device whose pads (PAD) are arranged in a zigzag alignment.

2. Description of Related Art

A semiconductor device is used in wide range of fields in association with advancement of downsizing and highly integrated packaging. In addition, there is a growing usage in fields in which high quality and reliability are demanded.

For the downsizing, a reducing of pitch of bonding pads has been proposed. For example, in a semiconductor device including a cell portion and a buffer circuit formed in the area surrounding the cell portion, the zigzag alignment formed on a circumference area of the buffer circuit and on the buffer circuit is proposed for reducing the pitch of bonding pads in Japanese Laid-Open Patent Application (JP-P2003-163267A).

Also, a semiconductor device is disclosed in Japanese Laid-Open Patent Application (JP-P2002-329742A). In the semiconductor device whose wires for connecting to outside or bonding pads are arranged in a zigzag alignment, test pads for contacting a probe in wafer test are formed on vacant area in the zigzag bonding pads.

SUMMARY

The related techniques described above cope with the reduction of pad pitch by arranging bonding pads in a zigzag alignment. In manufacturing process the inspection is performed, for example, by contacting a probe to a bonding pad.

The present inventor has recognized that the impact given to the pad by the probe can be considerably large. For this reason, when the probe contact is repeated in large number of times, there is a possibility that interconnections and elements such as inputting and outputting buffer (referred to as an I/O buffer below) under the pads are damaged, which is a problem to be solved.

In an aspect of the present invention, a semiconductor device includes a first pad arranged on a semiconductor chip and designed to be used for bonding, a second pad arranged on the semiconductor chip and designed to be used for both bonding and probing, and a third pad arranged on the semiconductor device and electrically connected to the first pad and designed to be used for probing.

In another aspect of the present invention, a semiconductor device includes a first pad arranged on a semiconductor chip and electrically connected to a first input/output buffer arranged on the semiconductor chip, a second pad and electrically connected to a second input/output buffer and arranged on an outer position of the semiconductor chip compared to the first pad, and a third pad and electrically connected to the first input/output buffer and arranged on an outer position of the semiconductor chip compared to the first pad.

The present invention seeks to solve one or more of the above problems, or to improve upon those problems at least in part, by providing a semiconductor device that can reduce the possibility of causing such a problem at a probing inspection and the like with maintaining the narrow pitch pads structure.

By employing these structures, the pitch of bonding pads can be reduced so that the downsizing of a semiconductor device can be achieved. And the possibility of causing problems at the probing inspection can also be reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3C is a view showing a second cross sectional surface;

FIG. 5B is a view showing a first cross sectional surface;

FIG. 5C is a view showing a second cross sectional surface;

FIG. 16 is a view showing a structure in which a bonding area and a probing area are separated.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
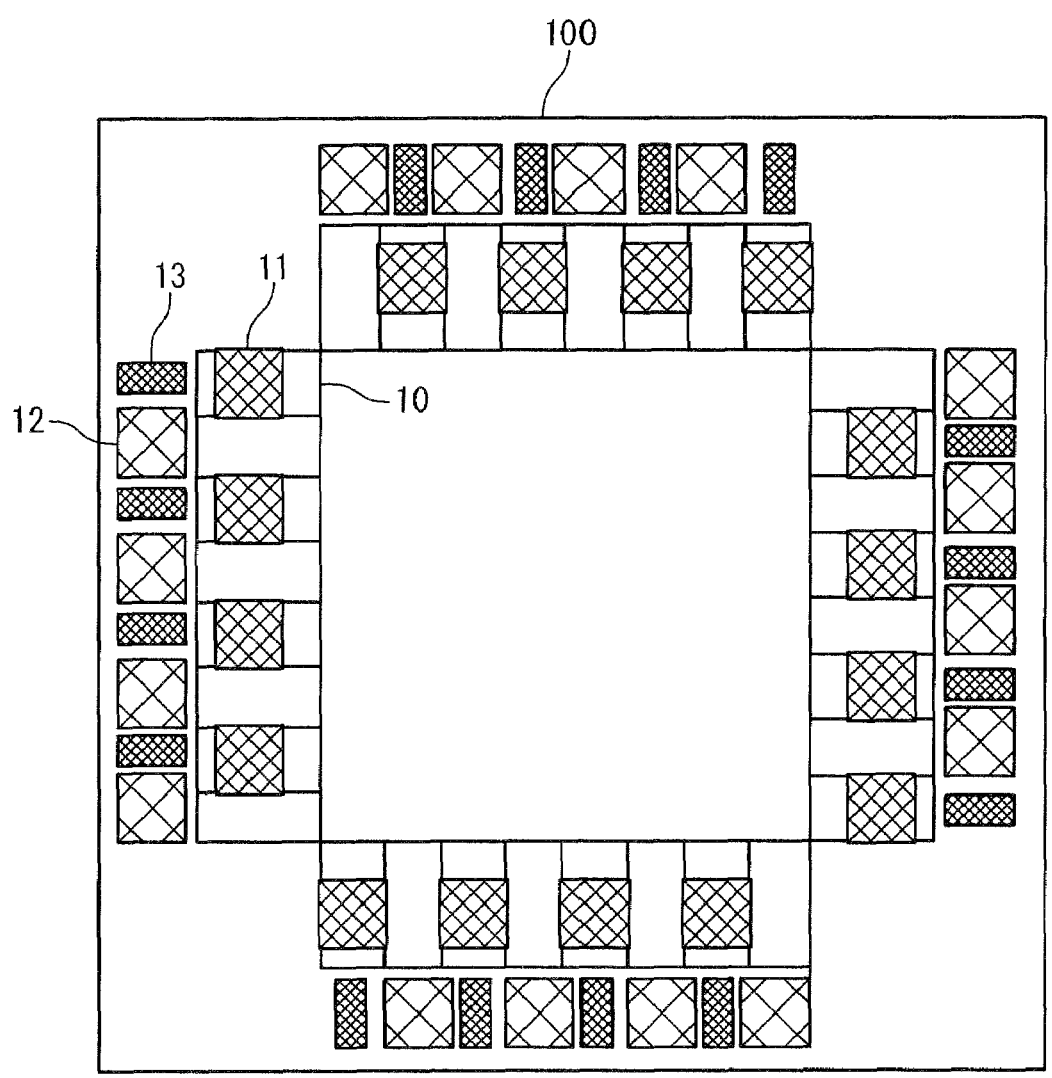
FIG. 1 is a view showing a general structure of a semiconductor device.

Referring not to FIG. 1, a semiconductor device according to a first embodiment of the present invention includes an I/O buffer 10, a first pad 11, a second pad 12, and a third pad 13.

The semiconductor device 100 of this embodiment is provided with a rectangular semiconductor chip in which internal interconnection layers having a laminated structure of a plurality of layers and internal elements are formed, and includes various kinds of processing circuit inside, and includes the I/O buffer 10 on respective sides of circumference part. In addition, the first pad 11 is formed on an uppermost part in an area where the I/O buffer is formed. The second pad 12 and the third pad 13 are further formed outside the above-described area.

Figure 2:
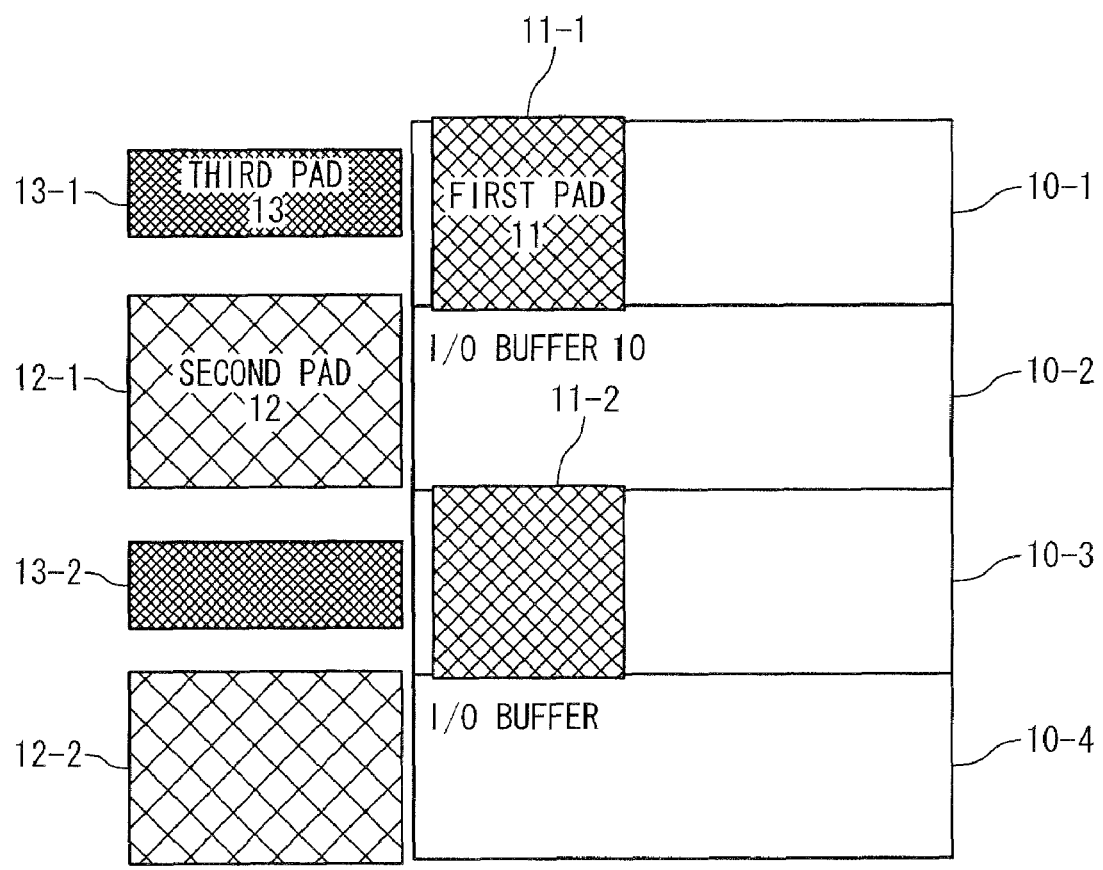
FIG. 2 is a view showing a first embodiment of the present invention.

In FIG. 2, only a part of one side of the semiconductor device is shown to describe the first, second, and third pads for simplification.

Each I/O buffer 10-$i$ ($i$=1 to n: n is an arbitrary natural number) of the I/O buffers 10 represents an inputting and outputting buffer. Each of the I/O buffers is indicated by "10-$n$". Each first pad 11-$i$ ($i$=1 to n) of the first pads 11 represents each of pads for bonding dedicated use. Each second pad 12-$i$ ($i$=1 to n) of the second pads 12 represents each of pads for bonding and probing use arranged outside area (circumference part) including the I/O buffer 10 and not electrically connected to the first pad 11. Each third pad 13-$i$ ($i$=1 to n) of the third pads 13 represents each of pads for probing dedicated use arranged outside the area (circumference part) and electrically connected to the first pad 11.

As shown in FIG. 2, by arranging the first pad 11 on the I/O buffer 10, the area where only a pad is formed is reduced so that the chip size can be reduced. The second pad 12 and the third pad 13 are not arranged on the I/O buffer 10 and an interconnection. An impact of probing performed in an inspection necessary for manufacturing can be avoided by employing a structure in which nothing is arranged immediately under the second pad 12 and the third pad 13. In addition, the second pad 12 is electrically connected the I/O buffer 10 not including the first pad 11.

The first pad 11 and the second pad 12 are arranged in a zigzag alignment. The zigzag alignment will be explained below with an example, where an arrangement of the first pad 11 and arrangement of the second pad 12 are taken as a matrix having rows and columns.

For example, in a case where the first pads 11 and the second pads 12 are arranged respectively in rows, a row on which the first pads 11 are arranged and a row on which the second pads 12 are arranged do not overlap and being parallel to each other.

The rows may be imperfectly parallel to each other. However, the second pads 12 are not arranged in a column on which the first pads 11 are arranged and the first pad 11 is not arranged in a column on which the second pads are arranged 12. These conditions are referred to as the "zigzag alignment". As far as the first pads 11 and the second pads 12 do not contact to each other, their columns may overlap to each other a bit. The arrangement conditions in which the rows are exchanged for columns and the columns are exchanged for the rows are also called as the zigzag alignment.

In addition, the first pads 11 and the second pads 12 are not necessarily arranged in the zigzag alignment or in alternating arrangement, though the zigzag or alternating arrangement is desirable. Actually, an arrangement where the first pads 11 and the second pads 12 are electrically connected to different I/O buffers is required at least.

Referring to FIGS. 3A, 3B, 3C, and 3D, a relation between a buffer and a pad in a case where inside pads have a CUP (Circuit Under Pad) structure and metal interconnection layers include 5 layers will be explained. As examples of material for metal interconnection, aluminum (Al), aluminum alloy, copper (Cu) and copper alloy can be considered, though conducting material (electricity conductor) being able to be used in semiconductor devices is required at least. In addition, the case of the metal interconnection layers having 5 layers is shown as an example, and the metal interconnection layers may have more than 6 layers or less than 4 layers. In short, a structure having an interconnection layer under a pad layer, that is, a multi-layer interconnection structure having a plurality of interconnection layers is intended.

Figure 3A:
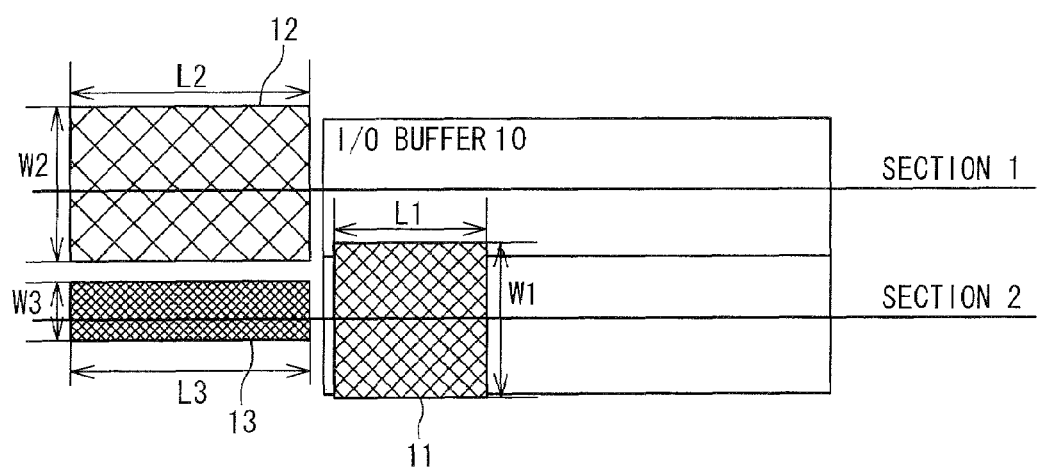
FIG. 3A is a view showing a relationship between a buffer and a pad (PAD)

FIG. 3A is a top view of the semiconductor device 100 showing the arrangement of the I/O buffer 10, the first pad 11, the second pad 12 and the third pad 13. Here, W1 is a width size of the first pad, L1 is a length size of the first pad, W2 is a width size of the second pad, L2 is a length size of the second pad, W3 is a width size of the third pad, and L3 is a length size of the second pad. It is characteristic that the width size of the second pad is larger than that of the third pad. This characteristic is desirable because the third pad has only a size required for probing since the third pad is dedicated to probing use, that is, for an inspection dedicated use. Also, a width size of the bonding pad can be smaller than that of the second pad, though details of the reason will be described later.

The term mentioned here as the "width size" is in a side direction of the semiconductor device 100 as can be understood from a contrast with above-described FIG. 1. Therefore, the above mentioned characteristic can also be said that a length of the third pad is shorter than that of the second pad in the side direction.

In FIG. 3A, the length size L2 of the second pad is longer than the length size L1 of the first pad. This is employed for the reason that it is preferable that the probing area and the bonding area do not overlap to each other because the second pad is a pad for probing and bonding. If the length sizes are same, there are possibilities that the surface condition of the top layer for probing is deteriorated by the probing repeatedly performed, so that a pad area on which a gold ball of a bonding wire is connected is reduced, and the strength of connection of the bonding wire is weakened. That is to say, as particularly shown in FIG. 11 described below, there is a possibility that a bonding quality is decreased depending on an increase of the area 113-1 where a connection area 11 where the gold ball is connected at bonding and an area 112-1 in which a scratch mark is remained by probing overlap to each other. To avoid this possibility, as shown in the view of FIG. 3D, the second pad is longer than the first pad since a probing portion and a bonding portion are separated.

Figure 4:
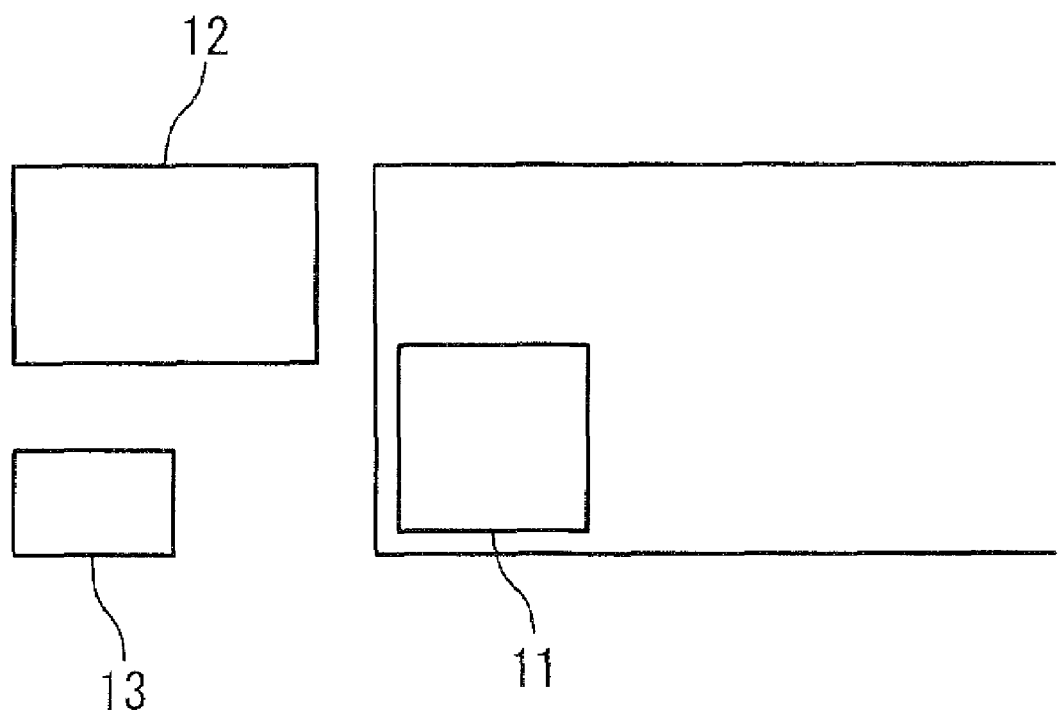
FIG. 4 is a view showing a second embodiment of the present invention.

If there is a clearance in which a length of the first pad can be lengthened so as to be as long as a length of the second pad, the length of the first pad may be the same length with the second pad. In addition, although a length size of the third pad is the same as that of the second pad in the drawings of the present embodiment, it can be shorter than that of the second pad as shown as a modified example in FIG. 4 since there is no bonding portion on the third pad. From the point of view of an economic efficiency of pad material, the third pad is preferable to be shortened.

Figure 3B:
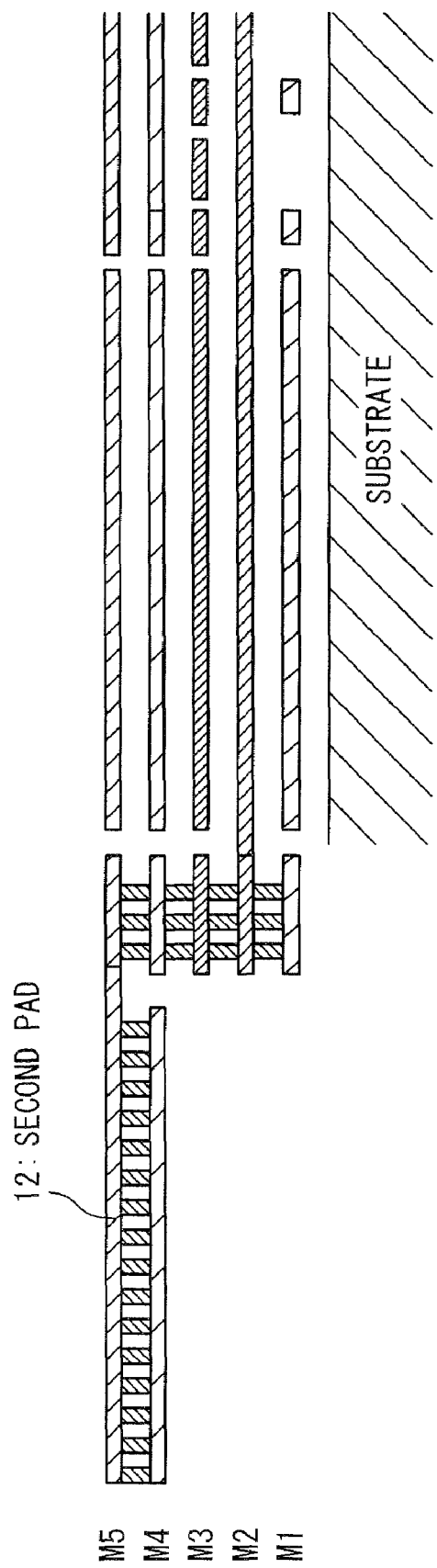
FIG. 3B is a view showing a first cross sectional surface.
Figure 3D:
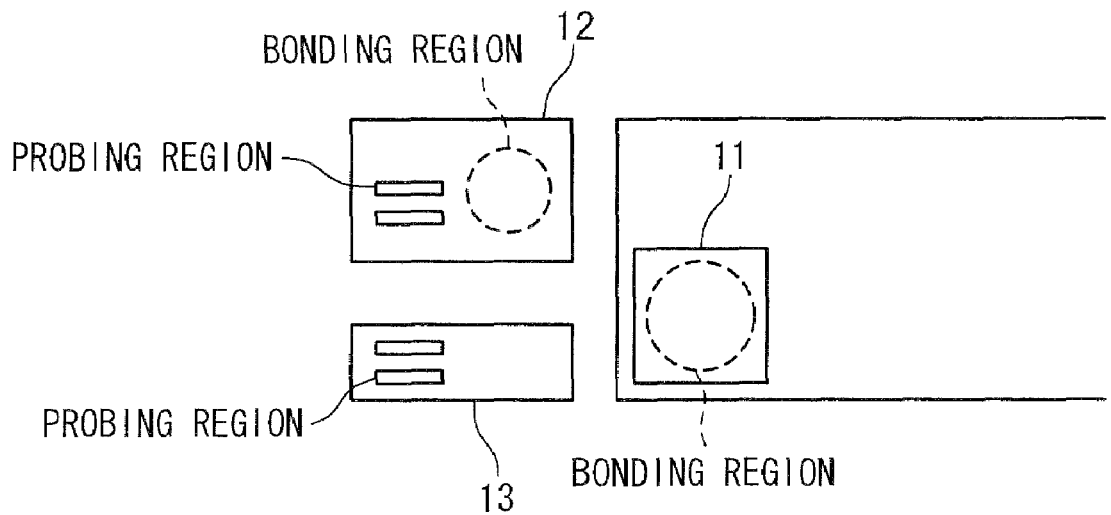
FIG. 3D is a view for explaining a bonding area and a probing area.

By using the cross sectional views of FIG. 3B and FIG. 3C, a structure of layers in the semiconductor device 100 is explained. FIG. 3B is a first cross sectional view showing cross sectional surface of the I/O buffer 10 and the second pad 12. That is to say, that is a cross sectional view at cross section 1 shown in FIG. 3A. FIG. 3C is a second cross sectional view showing cross sectional surface of the first pad 11 and the third pad 13. That is to say, that is a cross sectional view at cross section 2 shown in FIG. 3A.

As shown in FIGS. 3B and 3C, the semiconductor 100 includes five metal interconnection layers of metal 1 to metal 5 on a basement of a silicon substrate. An uppermost layer is the metal 5. Generally, respective interconnection layers are connected by a via hole and a contact hole. In addition, interlayer insulation films are provided between the respective interconnection layers.

As shown in FIG. 3B, the second pad 12 includes the metal 4 and the metal 5, and does not use the metal 3 and under. The metal 4 and the metal 5 used by the second pad 12 are connected to each other by contact holes. In the present embodiment, although two metal layers are used in structuring the second pad, a structure using only one metal layer may be employed.

As shown in FIG. 3C, the third pad 13 includes the metal 4 and the metal 5, and does not use the metal 3 and under. The metal 4 and the metal 5 used by the third pad 13 are connected to each other by contact holes. The first pad 11 includes the metal 4 and the metal 5, and the metal 4 and the metal 5 used by the first pad 11 are connected to each other by contact holes. In addition, the first pad 11 and the third pad 13 are electrically connected. In the present embodiment, although two metal layers are used in structuring the first and third pads, a structure using only one metal layer may be employed.

A specific example of pad size in the first embodiment of the present invention will be represented below. As already described, when an area of the first pad 11 is set to be a size required for bonding and an area of the third pad 13 is set to be a size required for probing, areas occupied by the pads can be reduced by reducing the area of the first pad 11 compared to the area of the second pad 12. The areas of respective pads do not depend on a relationship between a position of the I/O buffer and a position of each pad.

As already described, a relation of areas of respective pads in the present embodiment can be:

A type, in which the area of the third pad 13 < the first pad 11 < the second pad 12, or B type, in which the area of the third pad 13 < the first pad 11 = the second pad 12.

An example of sizes of respective pads in the case of the A type is shown below.

The first pad 11 has a width 70 to 80 μm and a height 70 to 80 μm.

The second pad 12 has a width 70 to 80 μm and a height 120 to 130 μm.

The third pad 13 has a width 30 to 40 μm and a height 120 to 130 μm. Each of the pads has a same thickness.

Here, when a surface of the respective arranged pads is seen from above (top view), a "horizontal width" represents the horizontal length of the pad and a "longitudinal width" represents the vertical length of the pad. It is also possible to reversely read the horizontal length and vertical length depending on a position where each pad is arranged.

In addition, it is preferable for the first pad to be shaped in nearly square. However, obviously it can be shaped in rectangle.

According to the first embodiment, since no interconnection layer exists under the second and third pads that are used for probing in inspection, and also an inputting and outputting area where elements such as a transistor are formed on, does not exist beneath the probing pads, the possibility of damage in the probing can be reduced. Furthermore, since a width size of the third pad that is used only for probing can be smaller than that of the second pad used also for bonding (W2>W3), all sizes in side directions become small and a structure having narrow pad structure and having reduced possibility to damage elements and interconnections can be provided.

By considering the first embodiment from other point of view referring to FIG. 2, it can also be said that the first embodiment has following three features. A first feature is to include the first pad 11-1 electrically connected to the first inputting and outputting buffer 10-1 via an interconnection (not shown in the figure) and further to include the third pad electrically connected to the first pad via an interconnection (not shown in the figure). A second feature is to include the second pad 12-1 electrically connected to the second inputting and outputting buffer 10-2 via an interconnection (not shown in the figure). A third feature is that the first pads are arranged on an inner position (or inside) of a semiconductor chip compared to the second pads and the third pads. Although the meaning of the "inner position" of the semiconductor chip is obvious from FIG. 1, explicitly saying an example of the "inner position", when comparing center points (an intersection point of diagonal lines from four corners) of respective pads with distances from the center points to nearest side of the semiconductor chip, a side having a larger distance is referred to as the "inner position".

Figure 5A:
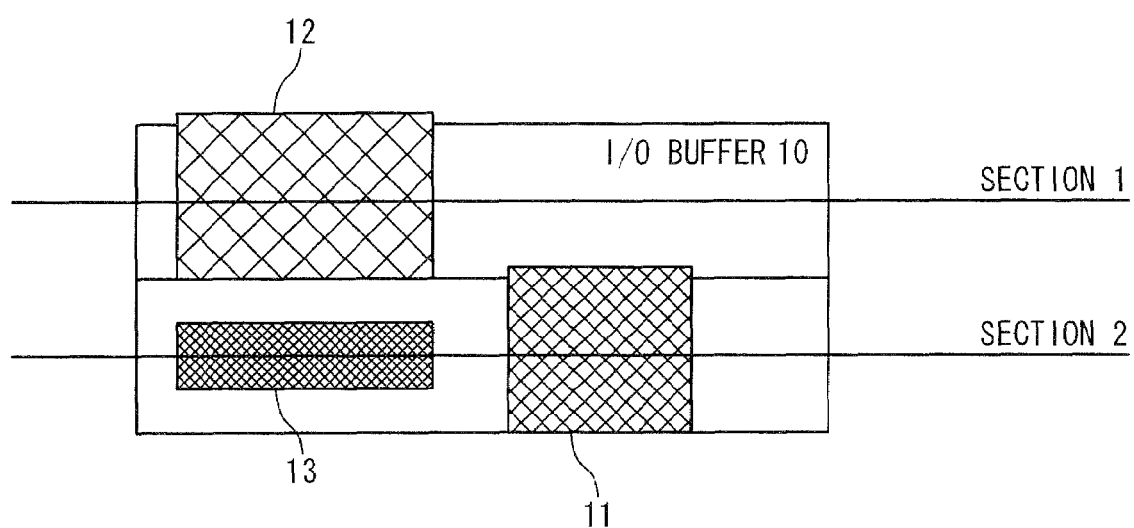
FIG. 5A is a view showing a relationship between a buffer and a pad (PAD)

Referring to FIGS. 5A, 5B, and 5C, a second embodiment of the present invention will be explained below.

The present embodiment contributes to a reduction of a chip size by arranging first pads 11, second pads 12 and third pads 13 on an I/O buffer 10 so that an area where only pads are formed on is reduced. A structure formed under the second pads and the third pads is durable against the impact of probing applied to the pads. That is to say, the structure includes a stress relaxation layer (stress absorbing layer). As an example of the stress absorbing layer, a layer on which no element or circuit is formed is provided just under the pad layer. Or the stress absorbing layer is an interconnection layer which is not used as a part of an electrical circuit of the semiconductor chip. Or structural material provided to form a metal layer does not exist in the stress absorbing layer. As another example of the stress absorbing layer, the stress absorbing layer can be constructed by a thick interlayer insulation film, which is thicker than an interlayer insulator existing below the first pad 11. Accordingly, as any other example, it is desirable to have an impact absorbing layer which absorbs an impact of probing.

Referring to FIG. 5A, a specific configuration will be explained.

The semiconductor device 100 of the present embodiment includes an I/O buffer 10, a first pad 11, a second pad 12, and a third pad 13.

The I/O buffer 10 (being an arbitrary member of I/O buffers 10-i, i=1 to n: n is an arbitrary natural number) is an inputting and outputting buffer. The first pad 11 (being an arbitrary member of first pads 11-i, i=1 to n) is a pad for bonding dedicated use arranged on the I/O buffer 10. The second pad 12 (being an arbitrary member of second pads 12-i, i=1 to n) is a pad for bonding and probing use arranged on the I/O buffer 10 and not electrically connected to the first pad 11. The third pad 13 (being an arbitrary member of third pads 13-i, i=1 to n) is a pad for probing exclusive use arranged on the I/O buffer 10 and electrically connected to the first pad 11.

The second pad 12 is arranged on I/O buffer 10 different from that the first pad 11 is arranged on, and the third pad 13 is arranged on the same I/O buffer 10 with the first pad 11.

Referring to FIGS. 5A, 5B, and 5C, a relation between a buffer and a pad in a case where inside pads is provided with a CUP (Circuit Under Pad) structure and a metal interconnection layer structure includes 5 layers will be explained. Examples of material for the metal interconnection are the same as those of the first embodiment.

FIG. 5A is a top view of the semiconductor device 100 showing an arrangement of the I/O buffer 10, the first pad 11, the second pad 12, and the third pad 13 seen from above. Sizes of respective pads are the same as those of the first embodiment, thus explanation thereof is omitted.

By using cross sectional views FIGS. 5B and 5C, a structure of layers of the semiconductor device 100 is shown. FIG. 5B is a first cross sectional view showing cross sectional surface (cross section 1) of the I/O buffer 10 and the second pad 12. FIG. 5C is a second cross sectional view showing cross sectional surface (cross section 2) of the first pad 11 and the third pad 13.

As shown in FIGS. 5B and 5C, the semiconductor 100 includes five metal interconnection layers of metal 1 to metal 5 on a basement of silicon substrate. An uppermost layer is the metal 5. Generally, respective interconnection layers are connected to each other by a via hole and a contact hole. In addition, interlayer insulation films are provided between the respective interconnection layers.

As shown in FIG. 5B, the second pad 12 is formed on the metal 4 and the metal 5, and the metal 4 and the metal 5 constituting the second pad 12 are connected by contact holes. Preferably the metal 3 just below the second pad is not used for forming elements or circuits. However, if an impact of probing is small, it can be arbitrarily determined whether the metal 3 under the second pad 12 is used for elements or circuits or not. If large impact is expected to be given to the second pad 12, it is better not to use the metal 3.

As shown in FIG. 5C, the third pad 13 is formed on the metal 4 and the metal 5, and the metal 4 and the metal 5 constituting the third pad 13 are connected by contact holes. Preferably the metal 3 just below the third pad 13 is not used for forming elements or circuits. However, if an impact of probing is small, it can be arbitrarily determined whether the metal 3 under the third pad 13 is used for elements or circuits or not. If a large impact is expected to be given to the third pad 13, it is better not to use the metal 3. The first pad 11 is formed on the metal 4 and the metal 5, and the metal 4 and the metal 5 constituting the first pad 11 are connected by contact holes. In addition, the first pad 11 and the third pad 13 are electrically connected.

Figure 6:
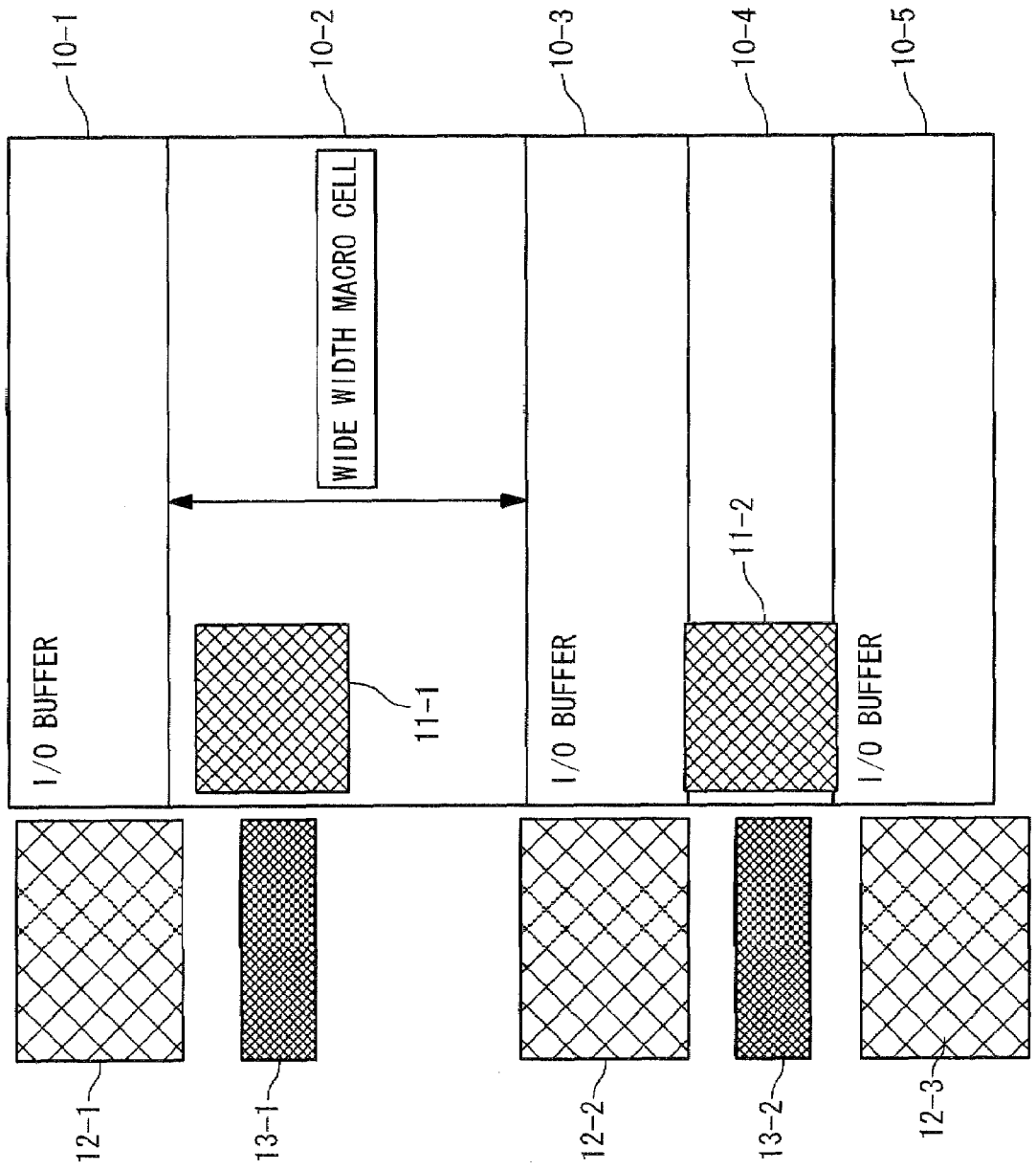
FIG. 6 is a view showing a second example of a fourth embodiment of the present invention.
Figure 7:
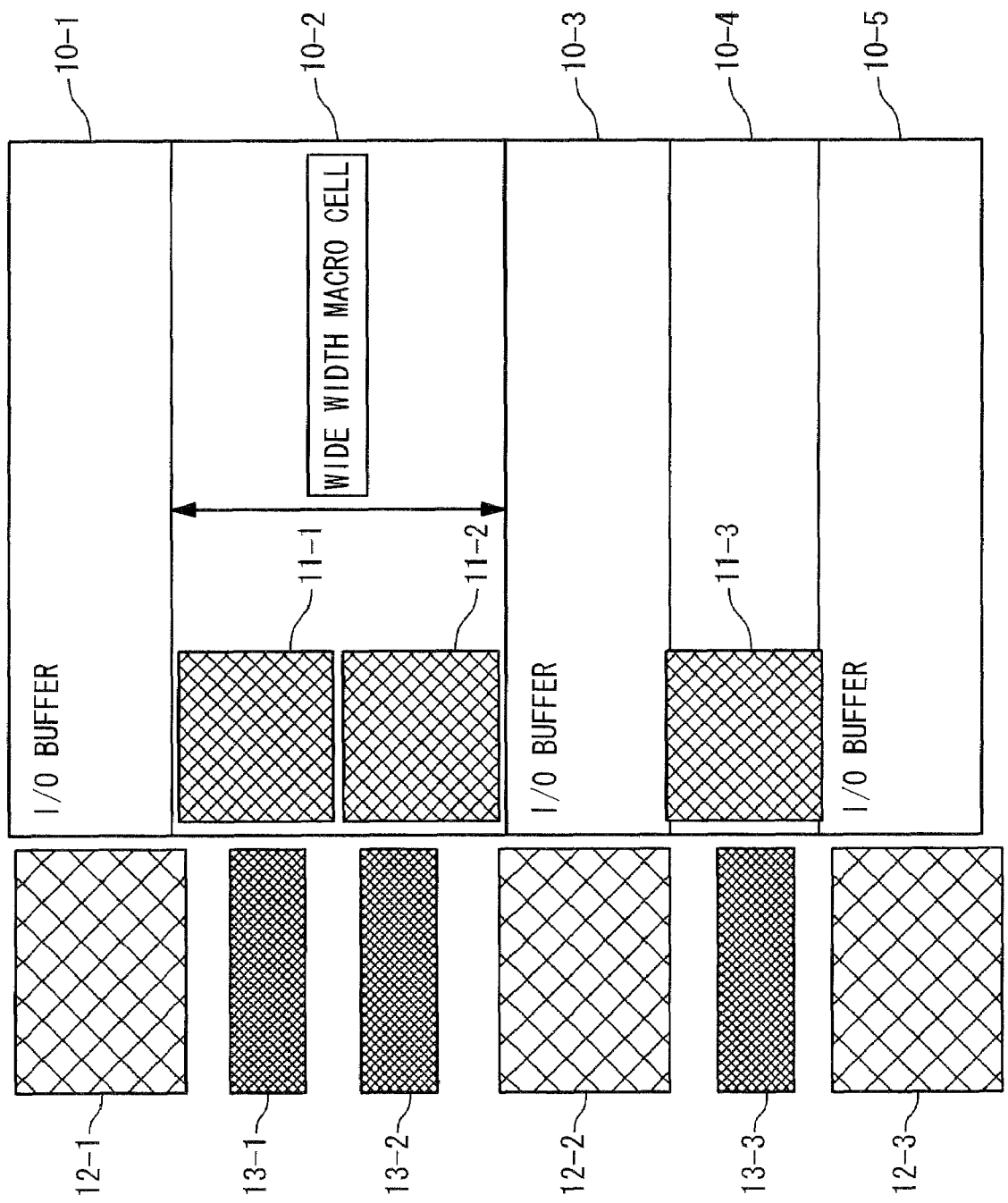
FIG. 7 is a view showing a third example of the fourth embodiment of the present invention.
Figure 8:
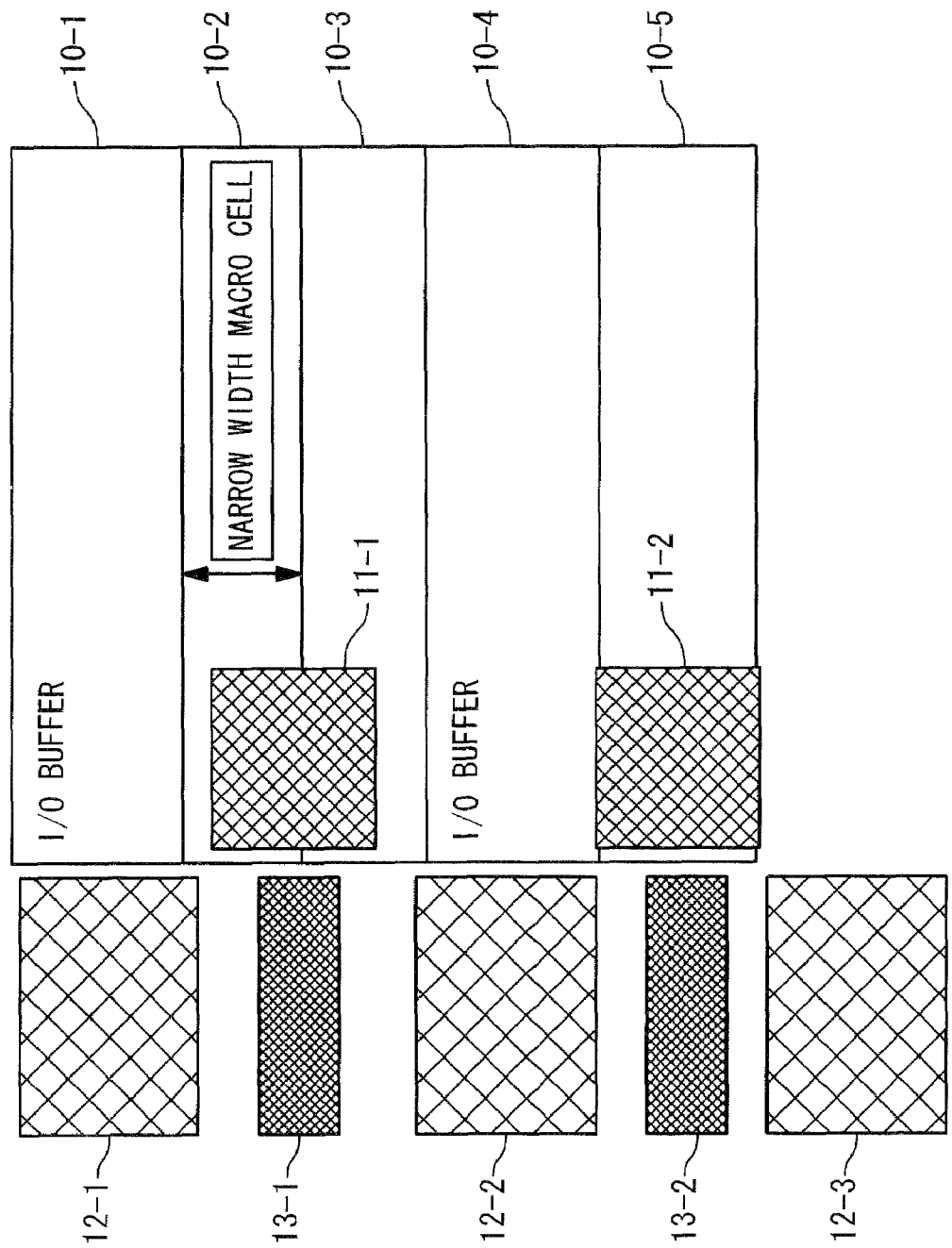
FIG. 8 is a view showing a fourth example of the fourth embodiment of the present invention.

Referring to FIGS. 6, 7, and 8, a third embodiment of the present invention will be explained below. When, of the I/O buffer 10 connected to the first pad 11, a buffer with a broader width than a pad pitch (a broad width macro) is arranged, for example, such as a macro with broad width (macro cell), the buffer can be arranged without changing a shape of the pad.

FIG. 6 shows a case where the first pad 11-1 is arranged on the I/O buffer 10-2 in a semiconductor device employing the broad width macro.

For example, as shown in FIG. 6, even when an I/O buffer 10-2 of the I/O buffers 10-1 to 10-5 is a broad width buffer, this broad width macro can be used as in the case of the normal I/O buffer 10-$i$ (the width thereof is not broad). That is to say, in the present embodiment, a size of the I/O buffer can be changed within some degree of freedom, and an arrangement of respective pads do not depend on a relationship between position of each I/O buffer and position of each pad.

In addition, when the broad width macro is used, a plurality of the first pads can be arranged on one broad width macro.

For example, as shown in FIG. 7, a first pad 11-1 and another first pad 11-2 are arranged on a same I/O buffer 10-2 which is a broad width macro. The first pad 11-1 and a third pad 13-1 is electrically connected. When the first pad 11-1 and the first pad 11-2 are assumed to be one first pad, and the third pad 13-1 and the third pad 13-2 are assumed to be one third pad, the configuration is the same as that of the first embodiment.

When the first pad 11-1 and the first pad 11-2 which are formed on a same broad width macro are assumed to be one first pad, it can be assumed that a plurality of the third pads (the third pad 13-1 and the third pad 13-2) is connected to the one first pad.

Conversely, when a buffer with narrower width than a pad pitch (which is referred as narrow width buffer) is formed, the one first pad 11 can be arranged on a plurality of narrow width macros.

For example, as shown in FIG. 8, the first pad 11-1 is arranged on two I/O buffers 10-2, 10-3, which are narrow width macros. The first pad 11-1 and the third pad 13-1 are electrically connected to each other. It is desirable that a same operation can be performed through either I/O buffer 10-2 or I/O buffer 10-3.

When the first pad 11-1 formed on the plurality of narrow width macros is assumed to be a plurality of first pads divided by a border of the plurality of the narrow width macros (the I/O buffer 10-2 and the I/O buffer 10-3), it can be assumed that one third pad 13-1 is connected to a plurality of the first pads.

A fourth embodiment of the present invention will be explained below with reference to attached drawings.

In some cases, an arrangement direction of pads is changed depending on a side of the chip. For example, when a probe is slid in one determined direction on pads, the second pad and the third pad to which the probe contacts are arranged so that a width in the sliding direction of the probe is longer in all sides.

Figure 9:
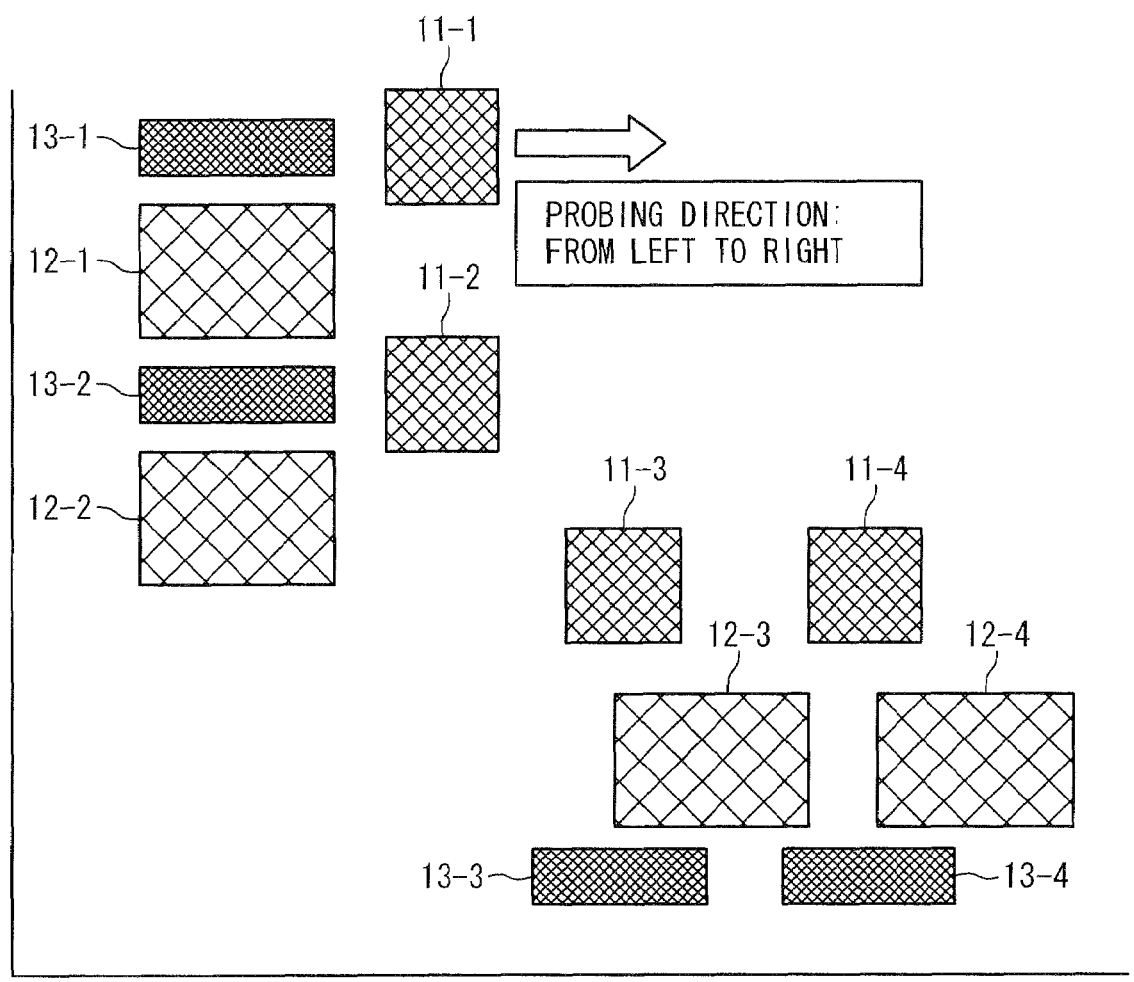
FIG. 9 is a view showing a fifth embodiment of the present invention.

FIG. 9 shows an arrangement of pads on a chip in the fourth embodiment.

For example, when a sliding direction of probe in probing is in a direction moving from a left side to a right side in FIG. 9, respective pads arranged in the left side of the drawing (left side of the chip) are arranged in the same way to the first embodiment. Since respective pads arranged in the lower position in the drawing (near side of the chip) is in a path where a probe moves from the left side to the right side in the drawing, the first pads 11 (shown as 11-3 and 11-4) for which the probing is not performed is normally arranged and the second pads 12 (12-3 and 12-4) and the third pads 13 (13-3 and 13-4) are arranged so that the widths in the sliding direction of the probe are longer. Namely, the longer direction of the second pad and the third pad is directed to be parallel to a moving direction of the probe in probing of the respective pads.

The positions where the second pad 12 and the third pad 13 are arranged can be out of alignment measurably. It is required at least that the first pad 11 and the third pad 13 are electrically connected and the first pad 11 is arranged on the inside of a semiconductor chip compared to the second pad 12 and the third pad 13.

As described above, the semiconductor device is required to have high quality and reliability, and the more downsizing is achieved, the more required space is reduced, therefore the semiconductor device raises its worth as a product. And a structure which can reduce a possibility that a probe damages interconnections and circuits in probing is desirable. The arrangements of pads in the semiconductor devices of the above explained embodiments are very effective to achieve these requirements.

As an additional effect, even when unexpected number of probing is required, a risk that loses the flatness of the bonding pad because of asperity of the surface of the bonding pad to reduce an area for connection with the bonding wire can be surely avoided since the probing inspection is not performed on a pad (the first pad 11) for bonding dedicated use.

Figure 10:
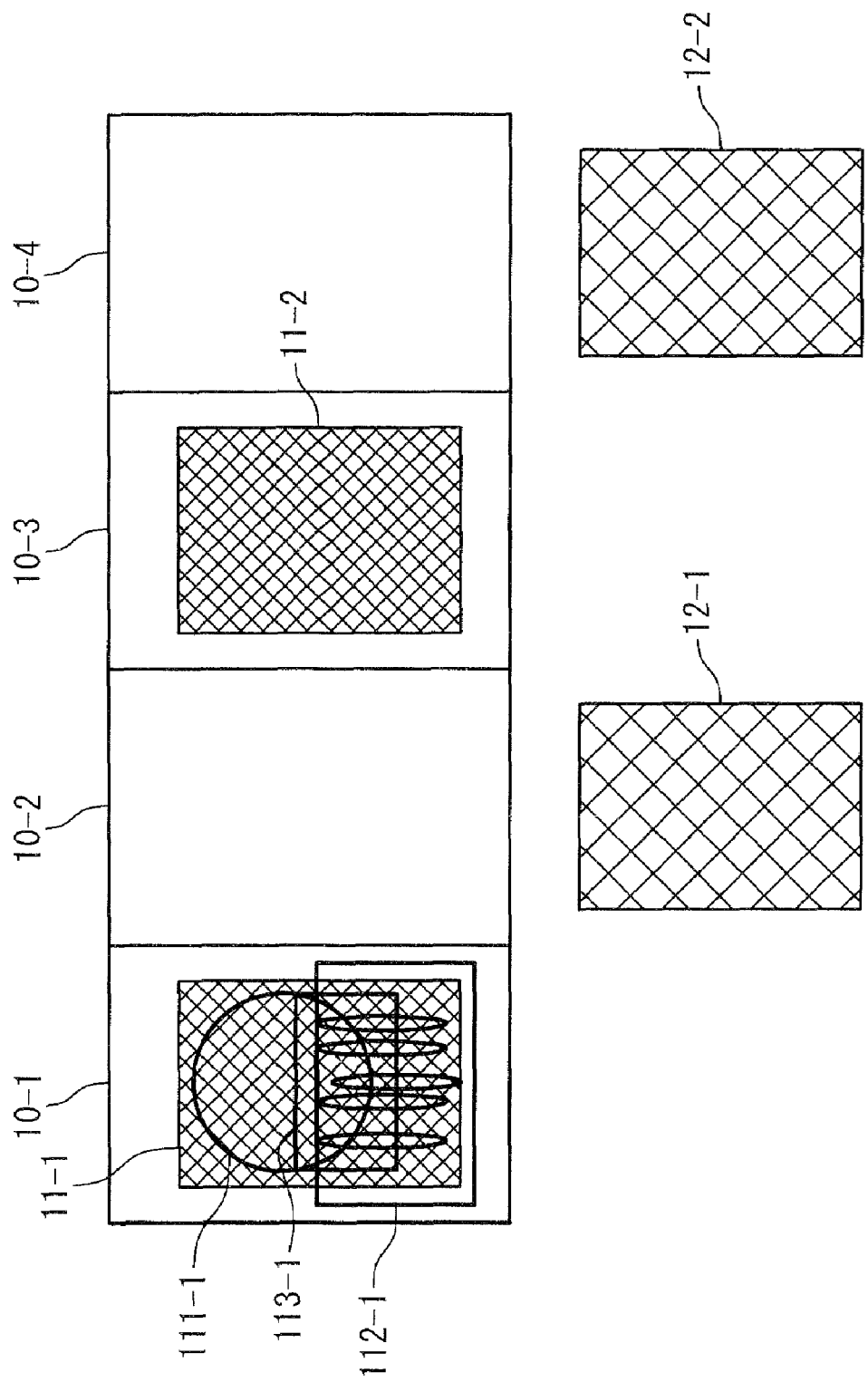
FIG. 10 is a view for explaining a problem in bonding after probing.

In a case of the CUP (Circuit Under Pad), when a considerable degree of probe contacts (probing) are performed, there are possibilities that a surface condition of a top layer is deteriorated, the area of the pads for connecting to the gold ball of the bonding wire is reduced, and the strength of connection for the bonding wire is decreased. For example, as shown in FIG. 10, there is a possibility that a bonding quality is decreased depending on the increase of area 113-1 where a connection area 111-1 of the gold ball and an area 112-1 of the probe mark are overlapped to each other. Each area 111-*i* (i=1 to n) of the areas 111 represents an area for connecting to the gold ball in the first pad 11. Each area 112-*i* (i=1 to n) of the areas 112 represents an area of the probing mark (the area to which a probe contact in probing) in the first pad 11. Each area 113-*i* (i=1 to n) of the areas 113 represents an overlapped area of the connecting area 111 of the gold ball and the probe mark area 112 in the first pad 11.

Figure 11:
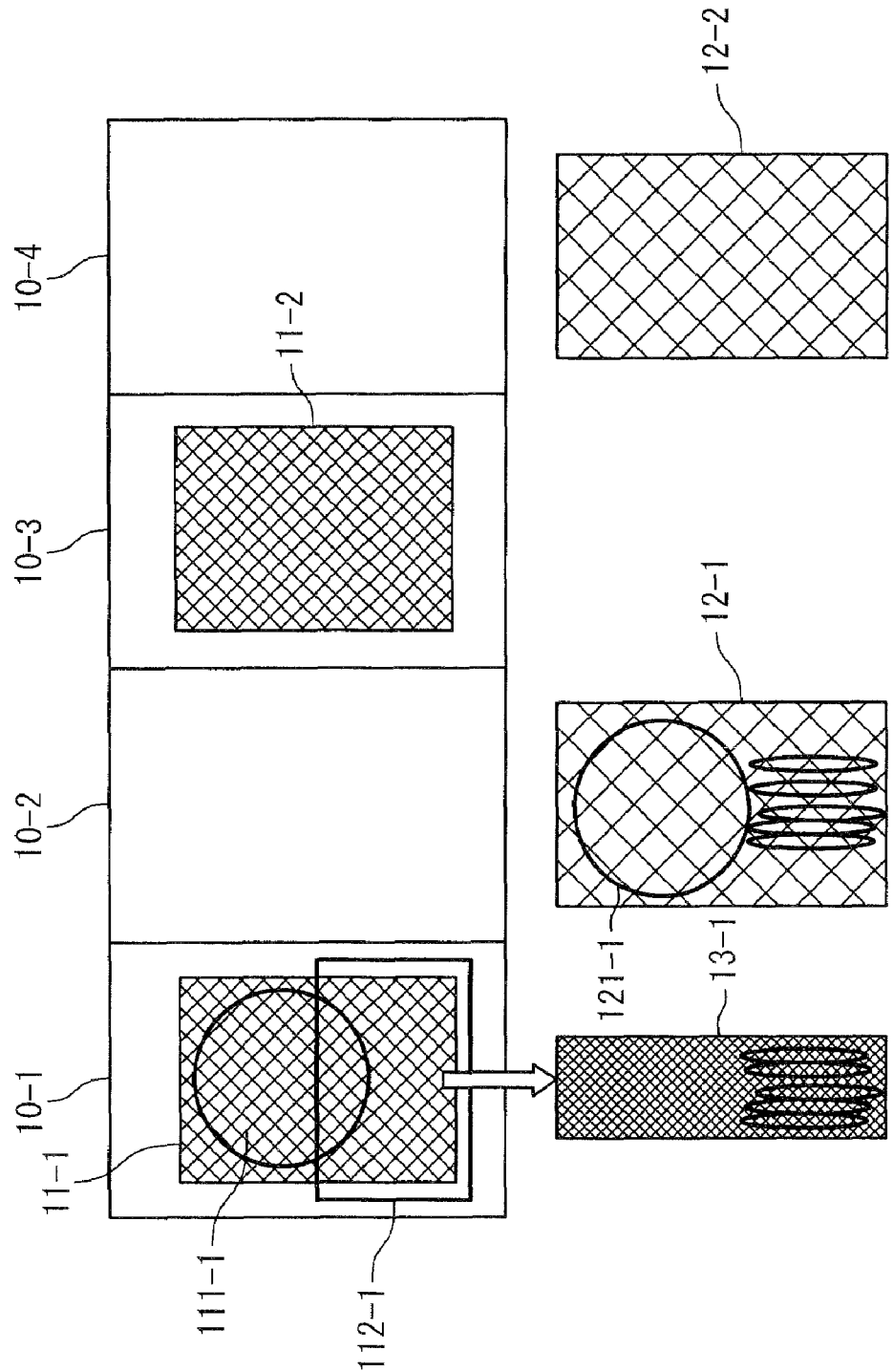
FIG. 11 is a view for explaining a solution of the problem.

To solve the above-described problem, probing has to be performed in an area where interconnections or elements which can be damaged by an impact of probing are not included under the pad or in an area where some treatment against an impact is done. That is to say, the probing area (area to which a probe contacts) is formed in a different position. For example, as shown in FIG. 11, the third pad 13-1 is provided on outside of the I/O buffer corresponding to the first pad 11-1 on the I/O buffer 10-1 and is used as probing dedicated use. The first pad 11-1 and the third pad 13-1 are electrically connected so that a probing inspection can be performed. As a result, a possibility that the surface condition of the top layer for the probe contact is deteriorated is reduced.

In addition, an area of the pad where the bonding wire is connected can be secured by employing the same measures. Each area 121-*i* (i=1 to n) of the areas 121 represents an area where the gold ball is connected in the second pad 12. The connecting area 121 of the gold ball is drawn to compare with the connecting area 111 of the gold ball in the first pad 11.

Figure 12:
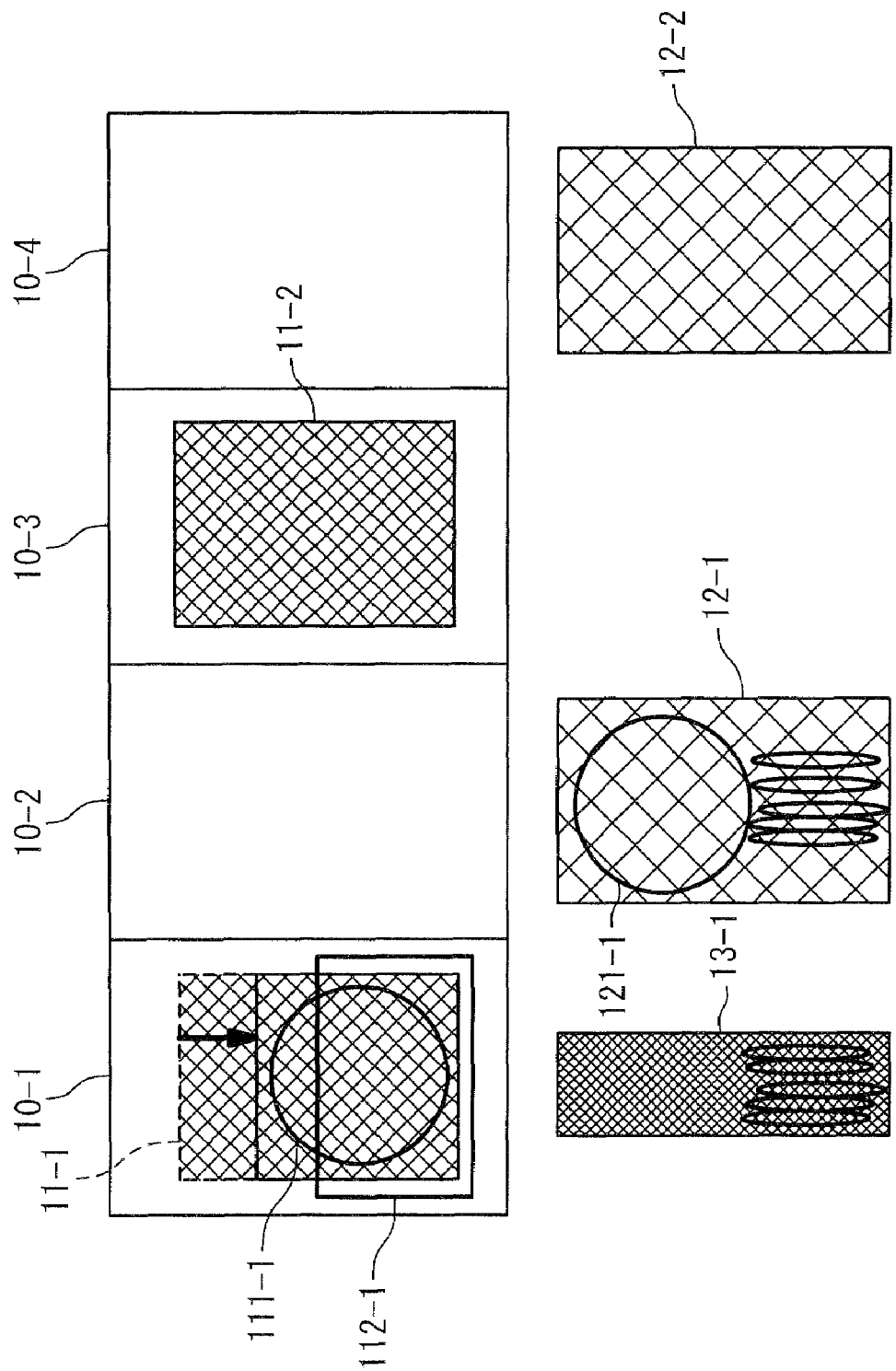
FIG. 12 is a view for explaining an application of the solution (reduction of pad area)

By separating the probing area and the bonding area, the first pad 11-1 can be downsized since it is not required to consider the area 112-1 of a probe mark marked in the bonding as shown in FIG. 12. That is to say, downsizing of the bonding pad can be achieved.

Figure 13:
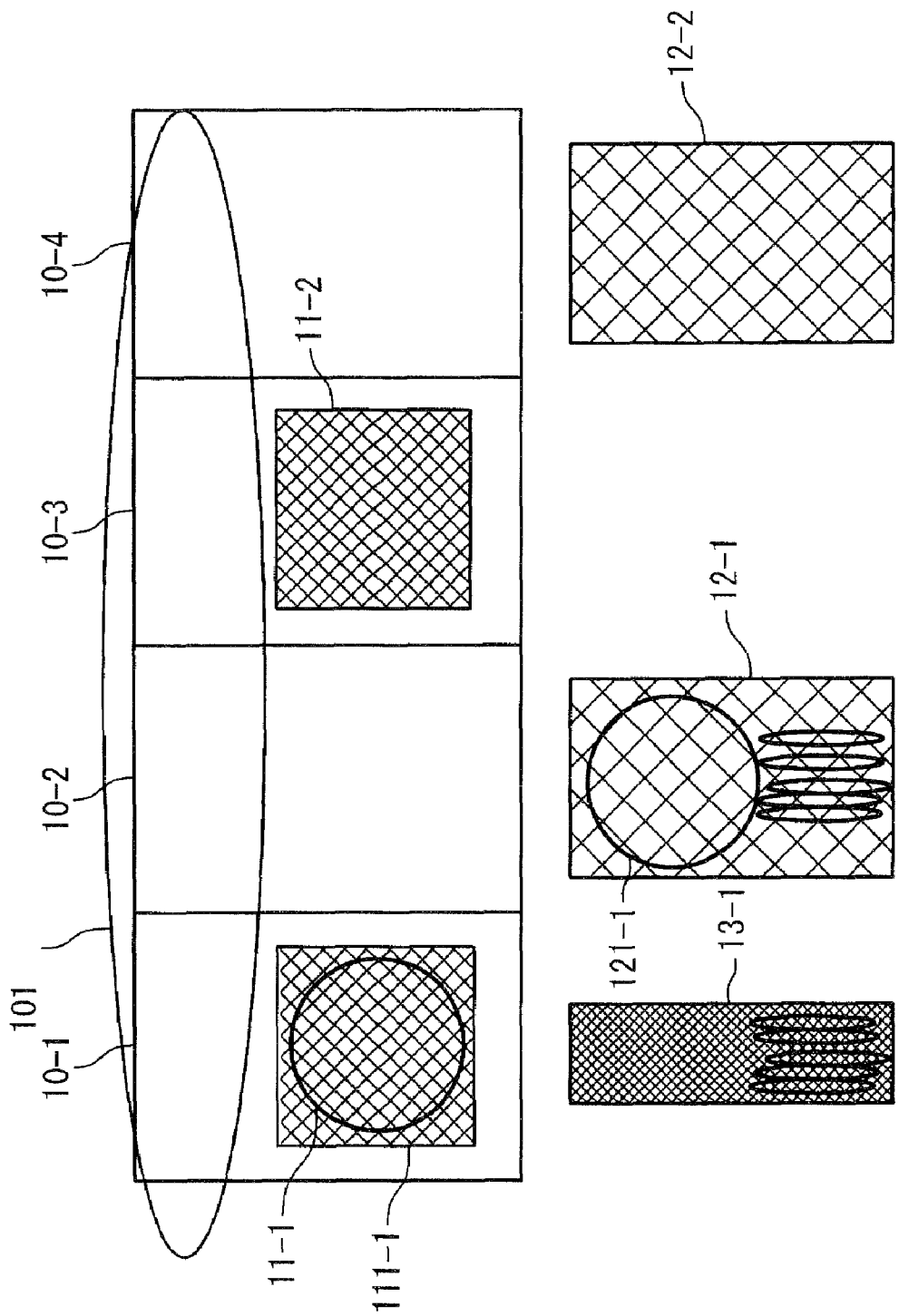
FIG. 13 is a view showing an example other than a CUP structure.

As a result of employing this structure, as shown in FIG. 13, an area of the upper side of the drawing can be reduced and the free space surrounded by an ellipse line can be provided for forming interconnection.

In the above explanation, cases of CUP (Circuit Under Pad) structures are explained. However, it is also possible to apply similar technique for a semiconductor device having a non-CUP structure. For example, none of the first pad 11, the second pad 12, and the third pad 13 exists on the I/O buffer 10. Such a semiconductor device is in common feature with the case of CUP structure in that the probe contact does not cause damages to the I/O buffer 10.

Figure 14:
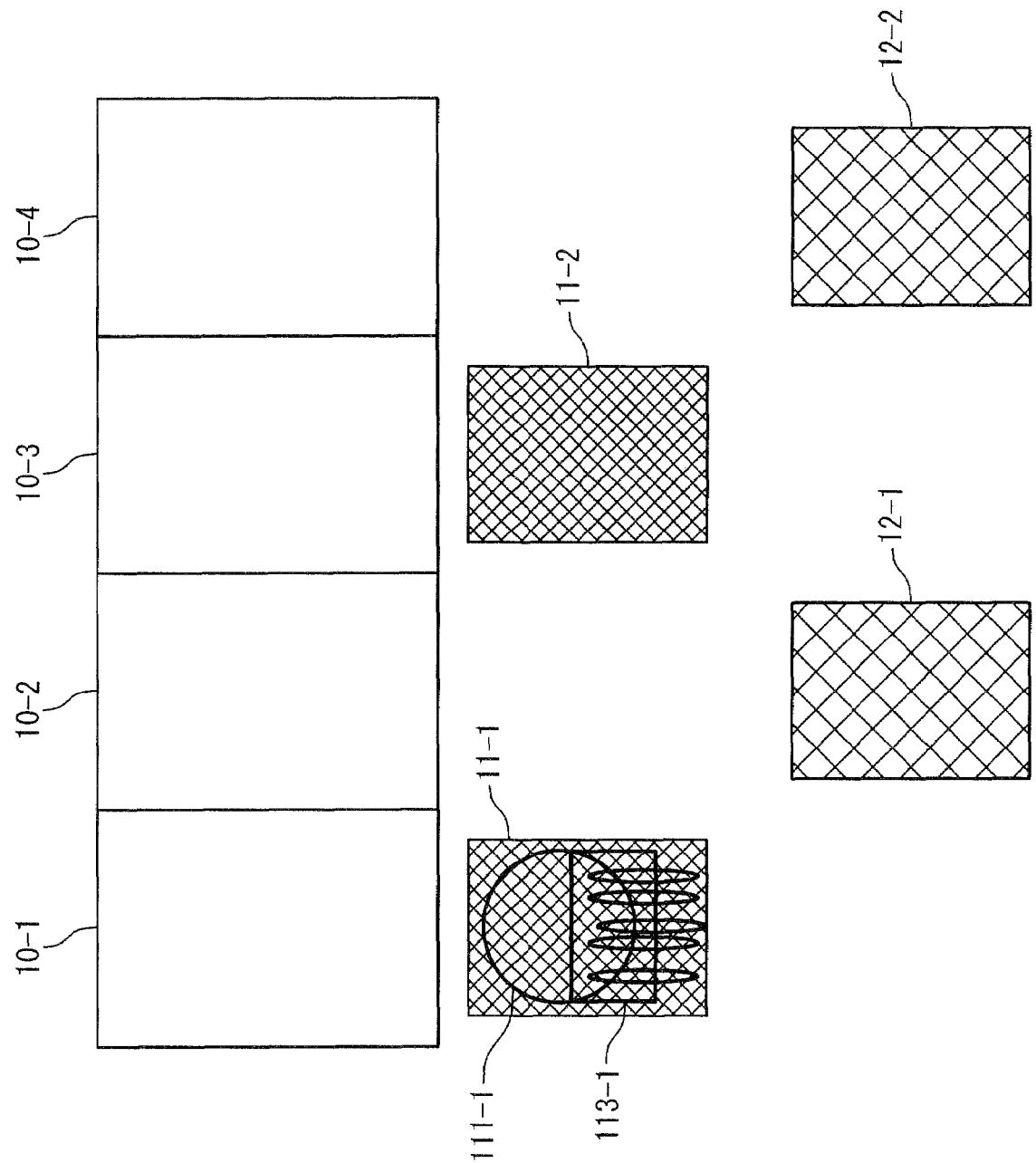
FIG. 14 is a view for explaining a problem in bonding after probing.

Referring to FIG. 14, a case of the semiconductor device having non-CUP structure will be explained. As shown in FIG. 14, the semiconductor device includes an I/O buffer 10, a first pad 11, and a second pad 12. The first pads 11 and the second pads 12 are arranged in a zigzag alignment along an arrangement direction of the I/O buffers 10. The first pads 11 are arranged on a position closer to the I/O buffers 10 than the second pads 12. Although description of the third pads 13 is abbreviated here, each third pad 13 is electrically connected to the first pad 11 as in the case of FIG. 5. Even in the semiconductor device having non-CUP structure, there is a possibility that the impact of probing damages the metal interconnection layer under the pad (PAD). Further, when probe contact is performed in a considerable number of times, there is possibility that the surface condition of the top layer is deteriorated and the pad area on which a gold ball of a bonding wire is reduced, and the strength of pad and bonding wire connection is decreased.

For example, as shown in FIG. 14, there is a possibility that a bonding quality is descended depending on increasing of area of an area 113-1 where the connection area 111-1 of the gold ball and the area 112-1 of the probe mark are overlapped to each other. The area 111-*i* (i=1 to n) of the areas 111 represents the area in the first pad 11 for connecting to the gold ball. The area 112-*i* (i=1 to n) of the areas 112 represents area in the first pad 11 of a probing mark (the area for connecting to a probe). The area 113-*i* (i=1 to n) of the areas 113 represents an overlapped area of the connecting area 111 of the gold ball and the probing mark area 112 in the first pad 11.

Figure 15:
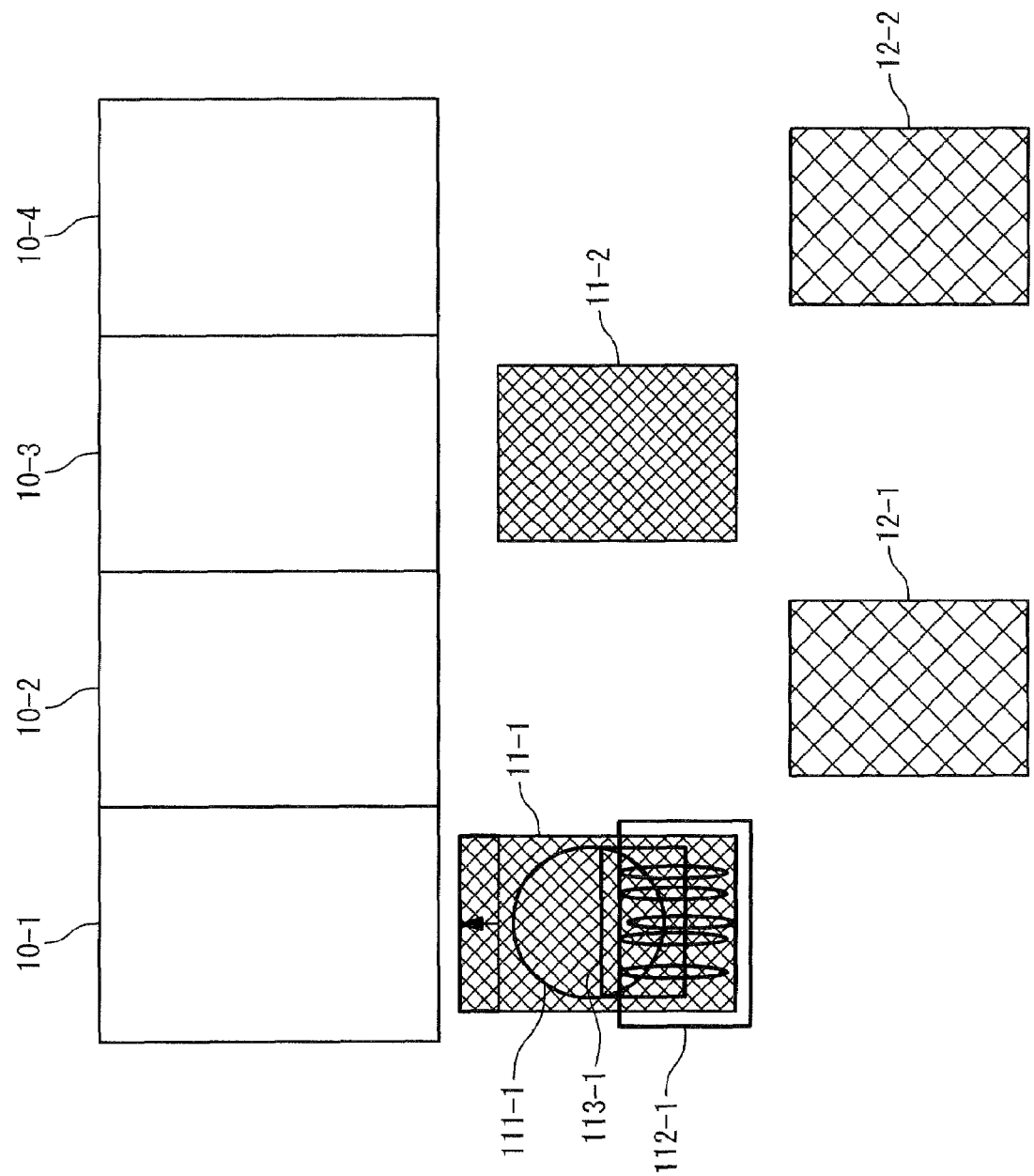
FIG. 15 is a view for explaining a reduction of an area where both probing and bonding are applied.

To solve the above-described problems, as shown in FIG. 15, the area of the first pad 11 is enlarged so that the area 113-1 where the connecting area of a gold ball and a probing mark are overlapped to each other is relatively reduced.

However, in the case of this structure, increasing of chip cost has to be considered because of increasing of an area occupied by the first pad. As a preparation for this increasing of the chip cost, there is a method for reducing an area occupied by the first pad by separating the bonding area and the probing area as shown in FIG. 16. That is to say, an area occupied by the first pad can be reduced by setting the first pad as a pad for bonding dedicated use (the bonding area) and by setting the third pad 13 electrically connected to the first pad 11 as a pad for probing dedicated use (the probing area). Thus, even in a normal PAD arranged in a zigzag alignment, an occupied area can be reduced.

As describe above, the present invention is explained with various embodiments from the various point of view. The present invention can also be understood from the following point of view.

The semiconductor device of an embodiment of the present invention is characterized by including: inspection pads arranged along a side of the chip; two-way pads arranged along the side of the chip so as not to overlap the inspection pads and used, in two-way, as pads for inspection and bonding; bonding pads electrically connected to the respective inspection pads and arranged on inside of the chip compared to the inspection pads and the two-way pads. In this case, each bonding pad can be smaller than each two-way pad.

As other points of view in common with some of the embodiments, the first pads used as bonding pads are arranged respectively on input/output buffers and the probing pads are arranged outside of the input/output buffers.

The present invention can be variously modified within the scope of ideas of the invention without sticking to above-described embodiments.

It is apparent that the present invention is not limited to the above embodiments, but may be modified and changed without departing from the scope and spirit of the invention.

What is claimed is:

1. A semiconductor device comprising:
   a first input/output buffer in a semiconductor chip;
   a first pad arranged on the semiconductor chip over the first input/output buffer, when viewed in a vertical cross section, and designed to be used for bonding;
   a second pad arranged on the semiconductor chip not over the first input/output buffer, when viewed in the vertical cross section, and designed to be used for both bonding and probing; and
   a third pad arranged on the semiconductor chip not over the first input/output buffer, when viewed in the vertical cross section, and electrically connected to the first pad and designed to be used for probing.

2. The semiconductor device according to claim 1, wherein the first pad is arranged on an inner position of the semiconductor chip compared to the second pad and the third pad.

3. The semiconductor device according to claim 2, wherein the first pad and the third pad are electrically connected to the first input/output buffer, and
the second pad is electrically connected to a second input/output buffer in the semiconductor chip spaced from the first input/output buffer.

4. The semiconductor device according to claim 1, wherein an area of the third pad is smaller than an area of the first pad in area.

5. The semiconductor device according to claim 1, wherein the first input/output buffer area includes a plurality of macro cells, and
the first pad is one of a plurality of first pads, and each of the plurality of macro cells is connected to more than two of the plurality of first pads.

6. A semiconductor device comprising:
a first input/output buffer in a semiconductor chip;
a first pad arranged on the semiconductor chip over the first input/output buffer, when viewed in a vertical cross section, and electrically connected to the first input/output buffer arranged on the semiconductor chip;
a second pad and electrically connected to a second input/output buffer and arranged on an outer position of the semiconductor chip compared to the first pad, the second pad not being over the first input/output buffer, when viewed in the vertical cross section, and not being directly electrically connected to the first input/output buffer; and
a third pad and electrically connected to the first input/output buffer and arranged on an outer position of the semiconductor chip compared to the first pad, the third pad not being over the first input/output buffer, when viewed in the vertical cross section.

* * * * *